US011156642B2

United States Patent
Kosuga et al.

(10) Patent No.: US 11,156,642 B2
(45) Date of Patent: Oct. 26, 2021

(54) CURRENT DETECTION APPARATUS

(71) Applicant: Hitachi Automotive Systems, Ltd., Hitachinaka (JP)

(72) Inventors: Masashi Kosuga, Hitachinaka (JP); Takeshi Kato, Hitachinaka (JP); Nobuaki Gorai, Hitachinaka (JP)

(73) Assignee: Hitachi Automotive Systems, Ltd., Hitachinaka (JP)

( * ) Notice: Subject to any disclaimer, the term of this patent is extended or adjusted under 35 U.S.C. 154(b) by 74 days.

(21) Appl. No.: 16/308,706

(22) PCT Filed: Jun. 7, 2017

(86) PCT No.: PCT/JP2017/021074
§ 371 (c)(1),
(2) Date: Dec. 10, 2018

(87) PCT Pub. No.: WO2018/003434
PCT Pub. Date: Jan. 4, 2018

(65) Prior Publication Data
US 2019/0146010 A1 May 16, 2019

(30) Foreign Application Priority Data
Jun. 30, 2016 (JP) .............................. JP2016-129540

(51) Int. Cl.
*G01R 15/20* (2006.01)
(52) U.S. Cl.
CPC ........... *G01R 15/207* (2013.01); *G01R 15/20* (2013.01)

(58) Field of Classification Search
CPC .............................. G01R 15/20; G01R 15/207
See application file for complete search history.

(56) References Cited

U.S. PATENT DOCUMENTS

| 2008/0094060 A1* | 4/2008 | Muraki ................. G01R 33/06 |
| | | 324/252 |
| 2010/0259255 A1 | 10/2010 | Hashio et al. |
| 2010/0315066 A1 | 12/2010 | Hashio et al. |

(Continued)

FOREIGN PATENT DOCUMENTS

| JP | 2008-275321 A | 11/2008 |
| JP | 2009-139272 A | 6/2009 |

(Continued)

OTHER PUBLICATIONS

International Search Report (PCT/ISA/210) issued in PCT Application No. PCT/JP2017/021074 dated Sep. 26, 2017 with English translation (five (5) pages).

(Continued)

*Primary Examiner* — Son T Le
*Assistant Examiner* — Adam S Clarke
(74) *Attorney, Agent, or Firm* — Crowell & Moring LLP

(57) ABSTRACT

A bus bar and a detection element uses resin to mold and integrate, leading to a disadvantage of complicating manufacturing. The bus bar is sandwiched and fixed between a second mold member and a first mold member. A sensor substrate on which a detection element is mounted is installed above the second mold member. The detection element is fixedly disposed at a position facing the bus bar, and detects a current flowing through the bus bar.

6 Claims, 5 Drawing Sheets

(56) References Cited

U.S. PATENT DOCUMENTS

| | | | | |
|---|---|---|---|---|
| 2013/0154617 A1* | 6/2013 | Kawaguchi | ............ | G01R 19/15 |
| | | | | 324/156 |
| 2013/0335076 A1* | 12/2013 | Sakamoto | ............ | G01R 15/207 |
| | | | | 324/244 |
| 2014/0049255 A1* | 2/2014 | Kitamoto | ............. | G01R 15/207 |
| | | | | 324/244 |
| 2014/0140119 A1* | 5/2014 | Shinohara | ............. | H02M 7/003 |
| | | | | 363/141 |
| 2018/0031613 A1* | 2/2018 | Nakayama | ............. | G01R 33/05 |
| 2019/0018047 A1* | 1/2019 | Fukuhara | ................ | G01R 19/15 |

FOREIGN PATENT DOCUMENTS

| | | |
|---|---|---|
| JP | 2010-2277 A | 1/2010 |
| JP | 2010-243440 A | 10/2010 |
| WO | WO 2011/090167 A1 | 7/2011 |

OTHER PUBLICATIONS

Japanese-language Written Opinion (PCT/ISA/237) issued in PCT Application No. PCT/JP2017/021074 dated Sep. 26, 2017 (three (3) pages).

\* cited by examiner

CURRENT DETECTION APPARATUS

TECHNICAL FIELD

The present invention relates to a current detection apparatus.

BACKGROUND ART

The power converter converts a DC voltage supplied from a power supply into an AC voltage and drives an AC motor. A controller of the AC motor controls the current detection apparatus to detect a current flowing through a bus bar between the AC motor and the power converter and performs control calculation for driving the AC motor on the basis of the detected value.

In a conventional current detection apparatus, resin is used to mold and integrate a bus bar and a detection element for detecting a current flowing through the bus bar (PTL 1).

CITATION LIST

Patent Literatures

PTL 1: JP 2008-275321 A

SUMMARY OF INVENTION

Technical Problem

The apparatus in PTL 1 described above uses resin to mold and integrate the bus bar and the detection element, leading to a disadvantage of complicating manufacturing.

Solution to Problem

A current detection apparatus according to the present invention includes: a bus bar; a detection element disposed at a fixed position with respect to the bus bar and configured to detect a current flowing through the bus bar; a shield member that magnetically shields the detection element from an external magnetic field; a first mold member provided between the shield member and the bus bar and on which a bus bar positioning portion for positioning the bus bar on the inside and a shield member positioning portion for positioning the shield member on the outside are formed; and a second mold member provided between the detection element and the bus bar and configured to sandwich and fix the bus bar in cooperation with the first mold member.

Advantageous Effects of Invention

According to the present invention, it is possible to provide a current detection apparatus that can be easily manufactured and capable of arranging the positional relationship between the bus bar and the detection element with high accuracy.

DESCRIPTION OF EMBODIMENTS

Figure 1:
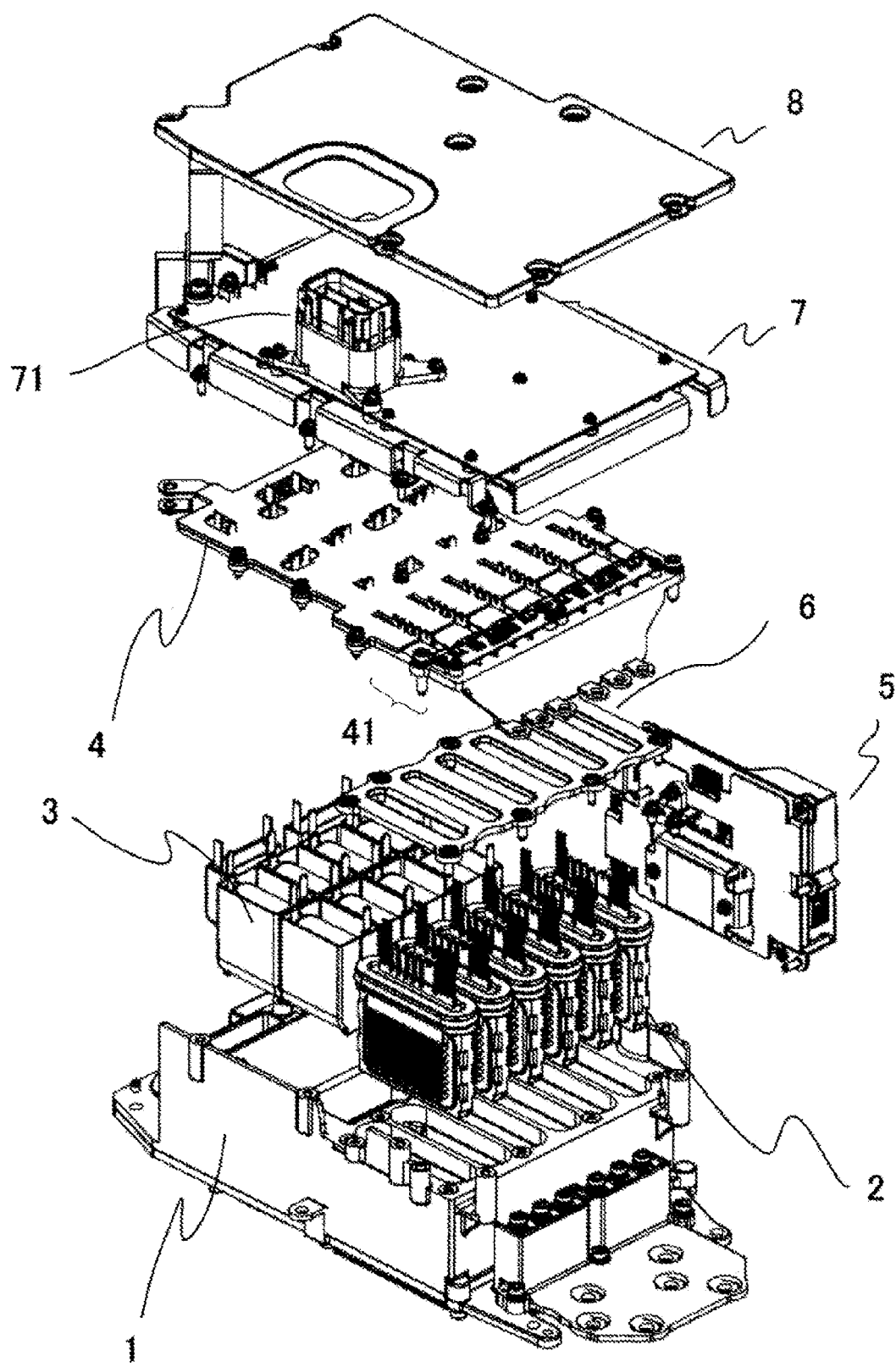
FIG. 1 is an exploded perspective view of a power converter.

An embodiment of the present invention will be described below with reference to the accompanying drawings. FIG. 1 is an exploded perspective view of a power converter. The power converter converts a DC voltage supplied from a power supply into an AC voltage and drives an AC motor.

A case 1 has a space for accommodating a power module 2 and a capacitor 3, and also includes a mounting portion for the mold bus bar 4. At the side of the power module 2, an auxiliary machine inverter 5 is arranged. On the upper side of the power module 2, a metal member 6 for fixing the power module 2 is provided. The power module 2 internally includes an inverter for driving the AC motor.

The mold bus bar 4 is attached to the case 1 from above the power module 2 and the capacitor 3. A current detection apparatus 41 to be described below is mounted on the mold bus bar 4. A metal base material 7 is provided above the mold bus bar 4 to hold a control substrate, a driver circuit substrate, or the like, on the metal base material 7. The metal base material 7 includes a connector 71 for connecting a signal line to the control substrate. A resin cover 8 for protecting the control substrate is provided above the metal base material 7.

Figure 2:
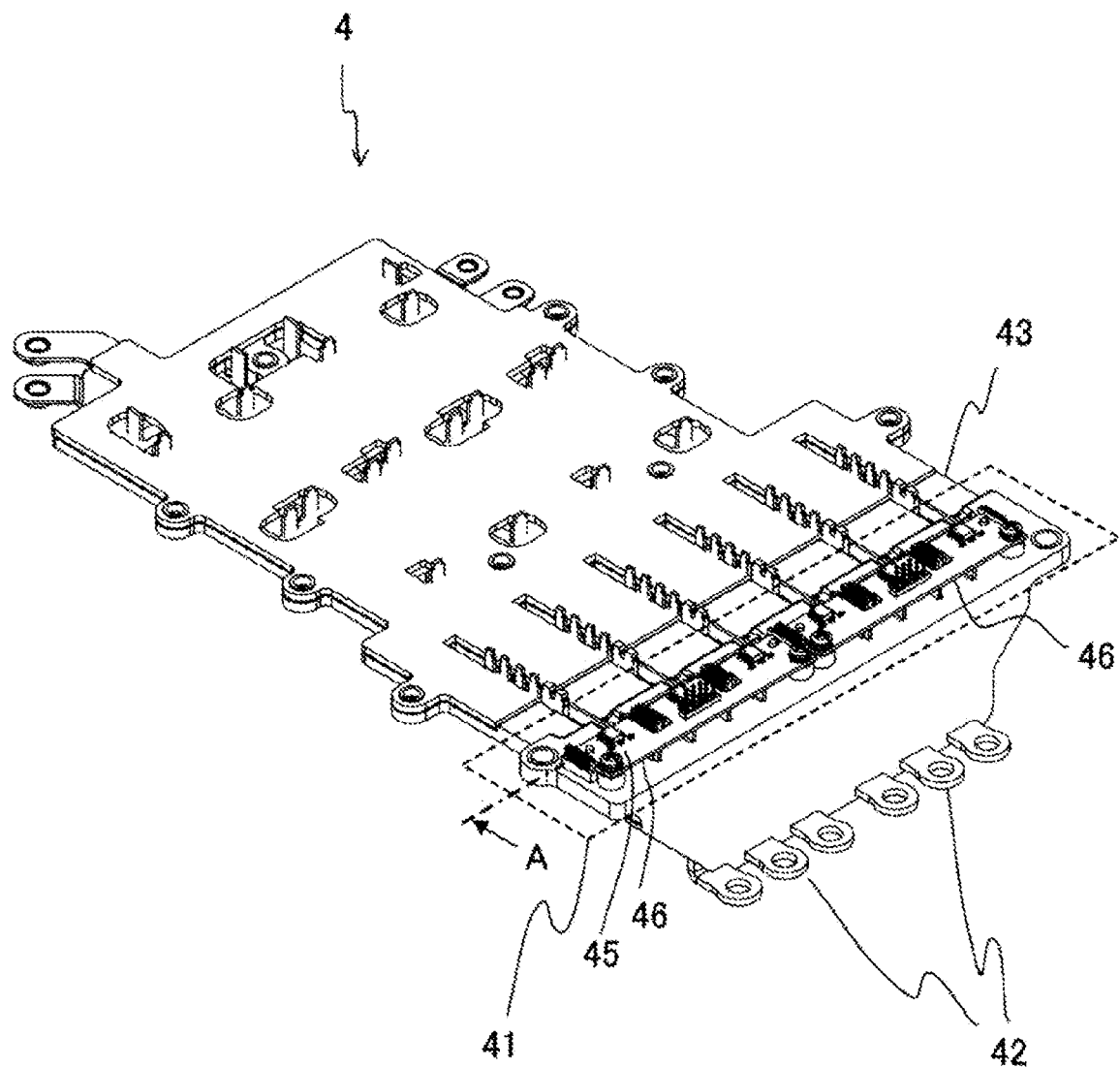
FIG. 2 is a perspective view of a mold bus bar.

FIG. 2 is a perspective view of the mold bus bar 4. The mold bus bar 4 includes the current detection apparatus 41, a bus bar 42, and a second mold member 43. The second mold member 43 is formed of resin having insulating performance. The current detection apparatus 41 is disposed at an end of the second mold member 43. The bus bar 42 is inserted into the inside of the current detection apparatus 41 from a terminal illustrated in the drawing and fixed by the second mold member 43. A detection element 45 is mounted on a sensor substrate 46 of the current detection apparatus 41. The detection element 45 is a coreless current sensor.

Figure 3:
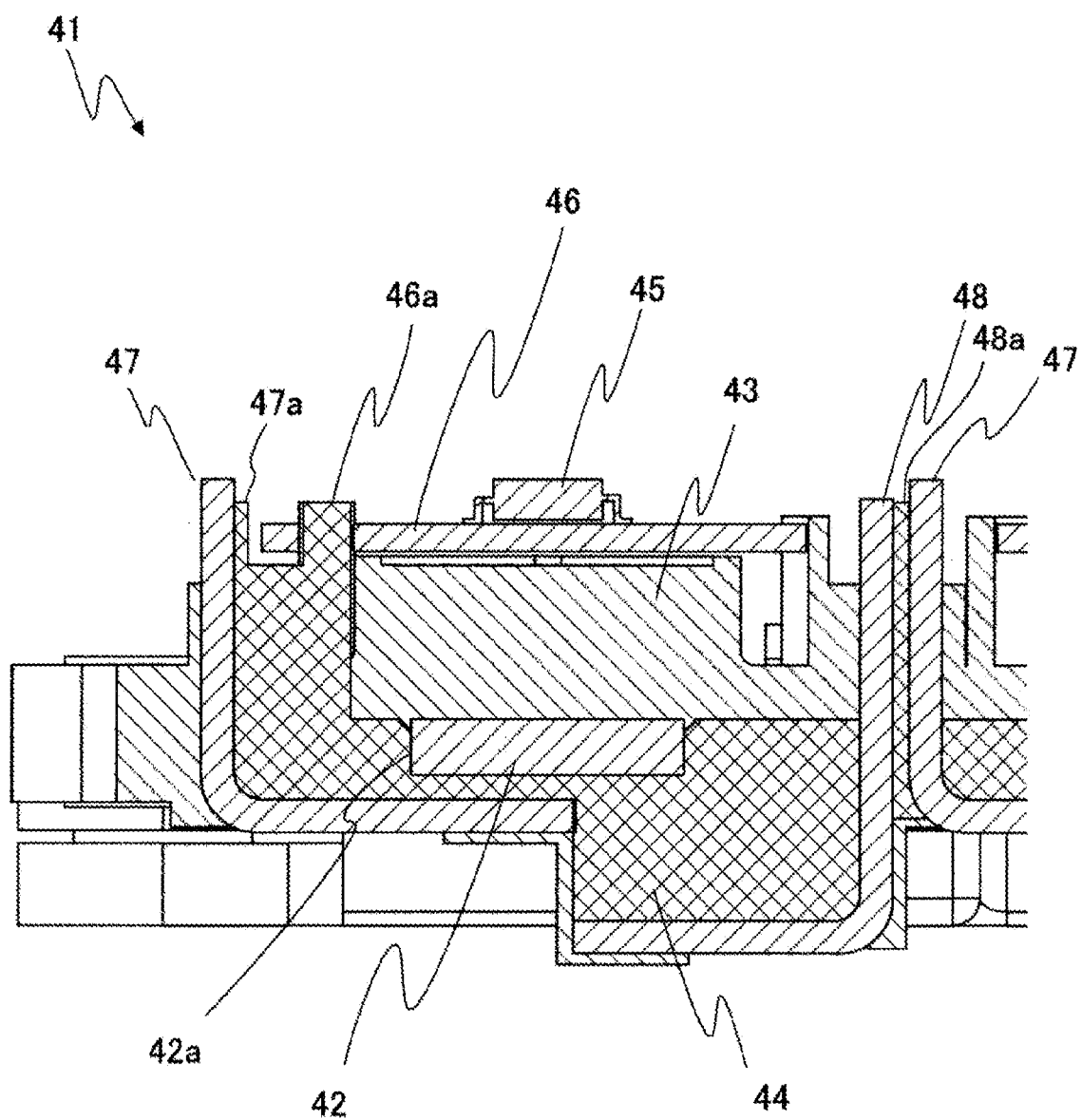
FIG. 3 is a cross sectional view of a current detection apparatus.

FIG. 3 is a cross sectional view of the current detection apparatus 41, and illustrates a cross section taken along line A-A in FIG. 2. The bus bar 42 is sandwiched and fixed between the second mold member 43 and the first mold member 44. The sensor substrate 46 on which the detection element 45 is mounted is installed above the second mold member 43. The detection element 45 is fixedly disposed at a position facing the bus bar 42, and detects a current flowing through the bus bar 42. Since the bus bar 42 is sandwiched and fixed between the second mold member and the first mold member 44, it is possible to facilitate assembly and manufacture of the current detection apparatus 41.

The first mold member 44 is formed of a resin having insulating performance. The first mold member 44 forms: a first shield positioning portion 47a for positioning a first shield member 47; and a second shield positioning portion 48a for positioning a second shield member 48. The first shield member 47 and the second shield member 48 are attached to the outside of the first mold member 44 by the first shield positioning portion 47a and the second shield positioning portion 48a. The first shield member 47 and the second shield member 48 magnetically shield the detection element 45 from an external magnetic field other than the bus bar 42.

Furthermore, the first mold member 44 includes a substrate positioning portion 46a and a bus bar positioning portion 42a. The substrate positioning portion 46a is a portion through which the sensor substrate 46 is inserted, and regulates an attachment position of the sensor substrate 46. The bus bar positioning portion 42a has a groove formed inward facing the position of the detection element 45, and the bus bar 42 is inserted and fixed into this groove. With such a configuration, it is possible to arrange the positional relationship between the bus bar 42 and the detection element 45 with high accuracy.

Figure 4:
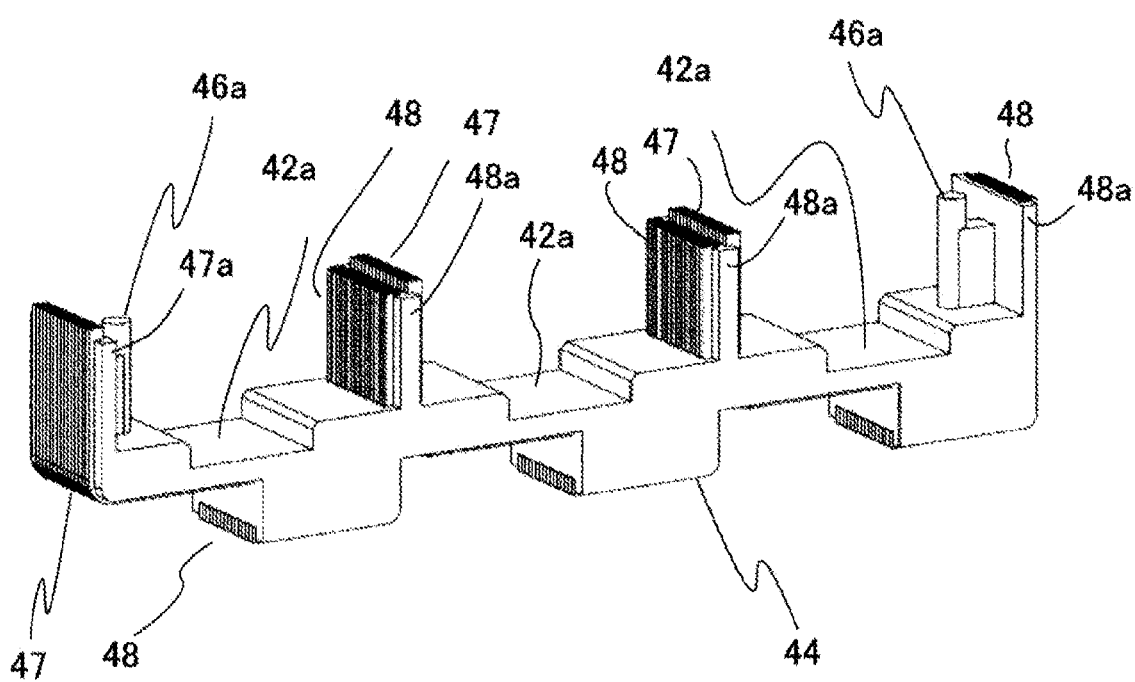
FIG. 4 is a perspective view of a first mold member.
Figure 5:
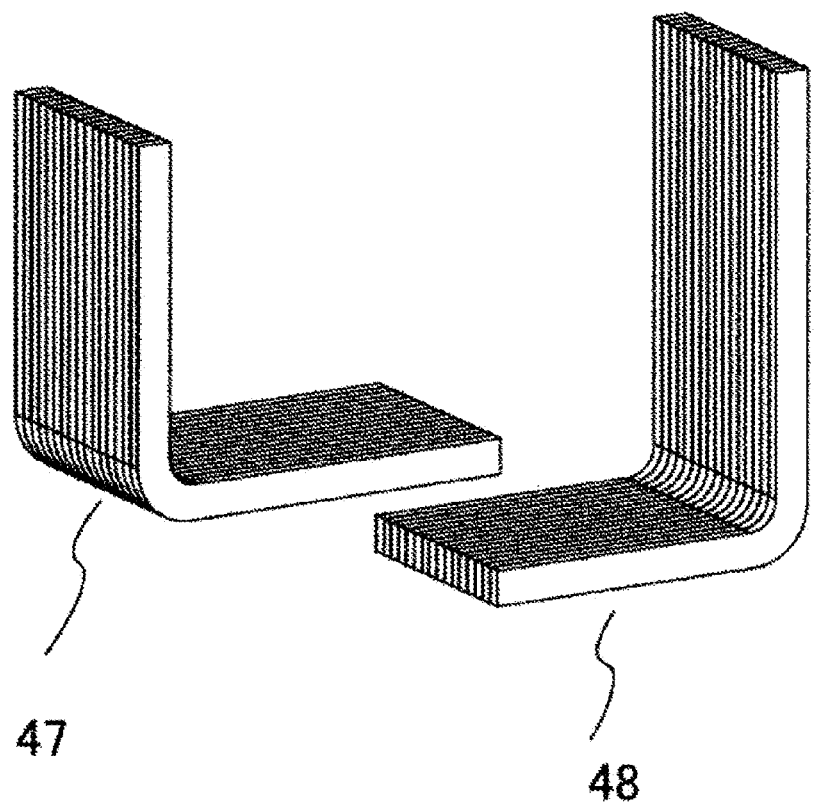
FIG. 5 is a perspective view of a first shield member and a second shield member.

FIG. 4 is a perspective view of the first mold member 44. The first mold member 44 includes three bus bar positioning portions 42a corresponding to three detection elements 45 arranged adjacent to each other. The first shield member 47 is attached to the first shield positioning portion 47a. The second shield member 48 is inserted and attached at the second shield positioning portion 48a. The first shield member 47 and the second shield member 48 are formed by laminating metal thin plate members, each being formed in an L shape as illustrated in FIG. 5. As illustrated in FIG. 4, the substrate positioning portion 46a is provided at both ends of the first mold member 44. Three detection elements 45 are installed on one sensor substrate 46, and the current detection apparatus 41 includes a total of two sensor substrates 46 (refer to FIG. 2).

According to the above-described embodiment, the following operational effects can be obtained.

(1) The current detection apparatus 41 includes: the bus bar 42; the detection element 45 disposed at a fixed position with respect to the bus bar 42 and configured to detect a current flowing through the bus bar 42; the first and second shield members 47 and 48 each configured to magnetically shield the detection element 45 from an external magnetic field; the first mold member 44 provided between the first and second shield members 47 and 48 and the bus bar 42 and on which the bus bar positioning portion 42a for positioning the bus bar 42 on the inside and the first and second shield positioning portions 47a and 48a for positioning the first and second shield members 47 and 48 on the outside are formed; and the second mold member 43 provided between the detection element 45 and the bus bar and configured to sandwich and fix the bus bar 42 in cooperation with the first mold member 44. With this configuration, it is possible to provide a current detection apparatus that can be easily manufactured and capable of arranging the positional relationship between the bus bar and the detection element with high accuracy.

(Modification)

The present invention can be implemented by modifying the above-described embodiment as follows.

(1) While the first mold member 44 has been described as having three bus bar positioning portions 42a, the first mold member 44 may include at least one bus bar positioning portion 42a.

(2) While the shield member has been described as being divided into two members, it is not limited to two, and the shield member may be divided into a plurality of members. Alternatively, the shield member may be formed with one member without being divided.

The present invention is not limited to the above-described embodiments, and other forms conceivable within the technical scope of the present invention are also included in the scope of the present invention as long as the features of the present invention can be maintained. Furthermore, a combination of the above-described embodiment(s) and a plurality of modifications may be adopted.

REFERENCE SIGNS LIST 1 case
2 power module
4 mold bus bar
41 current detection apparatus
42 bus bar
42a bus bar positioning portion
43 second mold member
44 first mold member
45 detection element
47 first shield member
47a first shield positioning portion
48 second shield member
48a second shield positioning portion

The invention claimed is:

1. A current detection apparatus comprising:
a bus bar;
a detection element disposed at a fixed position with respect to the bus bar and configured to detect a current flowing through the bus bar;
a shield member that magnetically shields the detection element from an external magnetic field;
a first mold member provided between the shield member and the bus bar and on which a plurality of adjacent bus bar positioning portions for positioning the bus bar on the inside and a shield member positioning portion for positioning the shield member on the outside are formed;
a second mold member provided between the detection element and the bus bar and configured to sandwich and fix the bus bar in cooperation with the first mold member; and
a substrate on which the detection element is mounted, wherein
the first mold member forms substrate positioning portions configured to position the substrate,
the bus bar has a rectangular cross section, and
the plurality of adjacent bus bar positioning portions of the first mold member being defined as rectangular grooves inwardly facing the position of the detection element and being in contact with a vertical surface of the bus bar and a horizontal surface of the bus bar.

2. The current detection apparatus according to claim 1, wherein the detection element is a coreless current sensor.

3. The current detection apparatus according to claim 2, wherein the shield member is inserted and attached at the shield member positioning portion of the first mold member.

4. The current detection apparatus according to claim 2, further comprising a substrate on which the detection element is mounted,
wherein the first mold member forms a substrate positioning portion for positioning the substrate.

5. The current detection apparatus according to claim 3, further comprising a substrate on which the detection element is mounted,
wherein the first mold member forms a substrate positioning portion for positioning the substrate.

6. The current detection apparatus according to claim 1, the shield member positioning portion of the first mold member is in contact with a vertical surface of the shield member and a horizontal surface of the shield member.

* * * * *